(12) United States Patent
Chen et al.

(10) Patent No.: US 12,550,780 B2
(45) Date of Patent: Feb. 10, 2026

(54) DIE RECONSTITUTION AND HIGH-DENSITY INTERCONNECTS FOR EMBEDDED CHIPS

(71) Applicant: Neuralink Corp., Fremont, CA (US)

(72) Inventors: Supin Chen, San Ramon, CA (US); Dongjin Seo, San Francisco, CA (US); Abhivyakti Gautam, Fremont, CA (US); Zachary M Tedoff, Hayward, CA (US)

(73) Assignee: Neuralink Corp., Fremont, CA (US)

( * ) Notice: Subject to any disclaimer, the term of this patent is extended or adjusted under 35 U.S.C. 154(b) by 454 days.

(21) Appl. No.: 17/968,610

(22) Filed: Oct. 18, 2022

(65) Prior Publication Data

US 2024/0128222 A1 Apr. 18, 2024

(51) Int. Cl.
| | |
|---|---|
| *H01L 21/56* | (2006.01) |
| *H01L 23/00* | (2006.01) |
| *H01L 23/13* | (2006.01) |
| *H01L 23/29* | (2006.01) |
| *H01L 23/31* | (2006.01) |

(52) U.S. Cl.
CPC ............ *H01L 24/20* (2013.01); *H01L 21/56* (2013.01); *H01L 23/13* (2013.01); *H01L 23/291* (2013.01); *H01L 23/293* (2013.01); *H01L 23/3135* (2013.01); *H01L 24/19* (2013.01); *H01L 24/32* (2013.01); *H01L 24/73* (2013.01); *H01L 2224/2101* (2013.01); *H01L 2224/2105* (2013.01); *H01L 2224/211* (2013.01); *H01L 2224/214* (2013.01); *H01L 2224/32225* (2013.01); *H01L 2224/32245* (2013.01); *H01L 2224/73267* (2013.01); *H01L 2924/1811* (2013.01); *H01L 2924/1815* (2013.01); *H01L 2924/182* (2013.01); *H01L 2924/186* (2013.01)

(58) Field of Classification Search
None
See application file for complete search history.

(56) References Cited

U.S. PATENT DOCUMENTS

| | | | |
|---|---|---|---|
| 11,107,703 B2 | 8/2021 | Tolosa et al. | |
| 11,444,056 B2 | 9/2022 | Chen et al. | |
| 2008/0280360 A1* | 11/2008 | Kaplan | C12N 5/0068 435/396 |
| 2011/0227487 A1* | 9/2011 | Nichol | G02B 6/0018 362/613 |

(Continued)

*Primary Examiner* — Nicholas J Tobergte
(74) *Attorney, Agent, or Firm* — Oblon, McClelland, Maier & Neustadt, L.L.P.

(57) ABSTRACT

Methods of manufacturing a sealed electrical device for embedded integrated circuit (IC) chips are described, as well as the resulting devices themselves. The sealed electrical device is created by removing material from a substrate to form a pocket in the substrate. An unencapsulated, or bare, IC chip can be placed within the pocket with connection pads of the IC chip facing outward. A gap between the IC chip and a side of the pocket can be filled with a filler. An uncured polymer can be cast over the substrate, which can be allowed to cure into a flat polymer sheet. Conductive traces can be patterned on the polymer sheet and to the connection pads of the IC chip. The conductive traces can then be coated with polymer to form a ribbon cable. Substrate can then be removed from underneath the ribbon cable, leaving substrate around the pocket to protect the IC chip.

11 Claims, 5 Drawing Sheets

(56) References Cited

U.S. PATENT DOCUMENTS

2018/0296243 A1   10/2018  Hanson et al.
2018/0335586 A1*  11/2018  Jou ...................... G02B 6/4214
2018/0366619 A1*  12/2018  Holbery ................ H10H 20/01
2020/0086111 A1    3/2020  Young et al.
2021/0013051 A1*   1/2021  Tolosa ................. A61N 1/0531

* cited by examiner

DIE RECONSTITUTION AND HIGH-DENSITY INTERCONNECTS FOR EMBEDDED CHIPS

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

BACKGROUND

1. Field of the Invention

Embodiments of the present invention generally relate to interconnections structures for embedded semiconductor integrated circuit (IC) chips. More specifically, embodiments relate to apparatuses and processes for die reconstitution and high-density interconnects for embedded IC chips.

2. Description of the Related Art

Implantable devices can be implanted into neurological tissue, such as the brain, to form a brain-computer interface. In certain instances, the implantable devices can contain a biocompatible substrate with conduits such as electrodes for recording neuronal signals and/or stimulation of neurons (such as through light, current, voltage, or drugs).

Such neuronal signals may be faint, analog, unprocessed signals, and may require analog-to-digital conversion, aggregation, and conversion to data packets and/or to human- or machine-readable formats, before they can be processed by digital computers. Such conversion, pre-processing, and formatting may require electronics occupying significant volume and adding significant weight to the brain implant. Accordingly, to make brain-computer interfaces viable, a lightweight, compact electronics package is needed.

There is a general need in the art for more compact electronics and interfaces between integrated circuits and stimulants from the outside world.

BRIEF SUMMARY

Generally, a "bare die" integrated circuit (IC) chip, instead of a larger, packaged chip, is placed in a hollow of a substrate so that its connection points are facing up, and then potted and planarized. Then a delicate ribbon cable is lithographically fabricated on top of the chip to connect to its connection points. A housing can be secured over the chip and ribbon cable to protect and seal them. A layer of silicon carbide or other sealant can be laid down above and below the chip to hermetically seal it from the elements.

The present disclosure is related to a method of manufacturing a sealed electrical device, the method including providing a substrate, removing material from the substrate to form a pocket in the substrate, placing an unencapsulated integrated circuit (IC) chip within the pocket with connection pads of the IC chip facing outward, filling a gap between the IC chip and a side of the pocket with a filler, casting an uncured polymer over the substrate and allowing the polymer to cure into a flat polymer sheet, patterning conductive traces on the polymer sheet and to the connection pads of the IC chip, coating the conductive traces with polymer to form a ribbon cable, and removing substrate from underneath the ribbon cable, and leaving substrate around the pocket to protect the IC chip.

The method can further include mounting a housing to a perimeter of the pocket, wherein the housing and the substrate left around the pocket enclose the IC chip.

The method can further include forming a metal ring on the perimeter of the pocket, wherein the housing is mounted onto the metal ring.

The method can further include depositing a hermetic coating over the IC chip within the pocket and before patterning the conductive traces, and etching vias through the hermetic coating to the pads of the IC chip.

The method can further include depositing a hermetic coating over the IC chip and the conductive traces, etching vias through the hermetic coating to power input pins of the IC chip, and connecting a circuit board through the vias to the power input pins.

The method can further include the hermetic coating being selected from the group consisting of silicon carbide, hafnium oxide, and diamond.

The method can further include filling of the gap by filling the gap with a polymer. The method can further include planarizing the substrate with the chip and the polymer.

The method can include the substrate being ceramic, glass, or polymer.

The method can include the substrate being a single crystal substrate of silicon, gallium nitride, or gallium arsenide.

The method can include the pocket being rectangular.

Some embodiments are related to a sealed electrical apparatus including a substrate having a pocket therein, a coating of silicon carbide, hafnium oxide, or a diamond inside the pocket, a bare die integrated circuit (IC) chip within the pocket of the substrate, and a ribbon cable lithographically formed on a portion of the substrate with conductive traces connecting to connection pads of the IC chip.

The apparatus can include a housing mounted to a perimeter of the pocket, wherein the housing and the substrate around the pocket enclose the IC chip.

The apparatus can include a metal ring on the perimeter of the pocket between the housing and the substrate.

DETAILED DESCRIPTION

"Power pads" include a VCC (Voltage Common Collector) and are typically held at a higher voltage with respect to GND (ground), although not always. VCC is the power input of a device. It may be positive or negative with respect to GND Disclosed herein are sealed electrical devices with embedded integrated circuit (IC) chips for use with an implantable brain-computer interface or other sensor interfaces. The sealed electrical device within an implant system can include a substrate with a pocket, into which the IC chip can be embedded. The IC chip can be connected to electrodes implanted in in-vivo neural tissue, such as a brain, via conductive traces (also referred to as "threads," "cables," or "wires"). The IC chip and traces can be sealed within hermetic layers extending from the electrode to the IC chip. Embedding the IC chips within the pocket of the substrate can decrease volume of the implant system, which can improve integration of the implant system within the brain. Additionally, a significant portion of the conductive traces can be located on the substrate at a higher density than would be practical on typical circuit boards, thereby further lowering the volume.

Electrical devices (e.g., implants) implanted within animals and humans can often require a hermetically sealed housing. Sealing can become increasingly challenging as the size of implants decreases and the number of electrical channels increases, causing increased failure points and constraints with sealing dimensions. Interconnections between the brain-computer interface and an implant can similarly become more challenging as implant size decreases and electrical channel count increases, as tighter dimensions can increase the risk of electrical shorting in the electronic device. By embedding a bare die IC chip within a pocket of a substrate and fabricating the interface (e.g., electrodes and conductive traces) with direct electrical connections to the IC chip, the IC chip and interface can be hermetically sealed and interconnected. The conductive traces may only be exposed at their connection to the electrodes.

Figure 1:
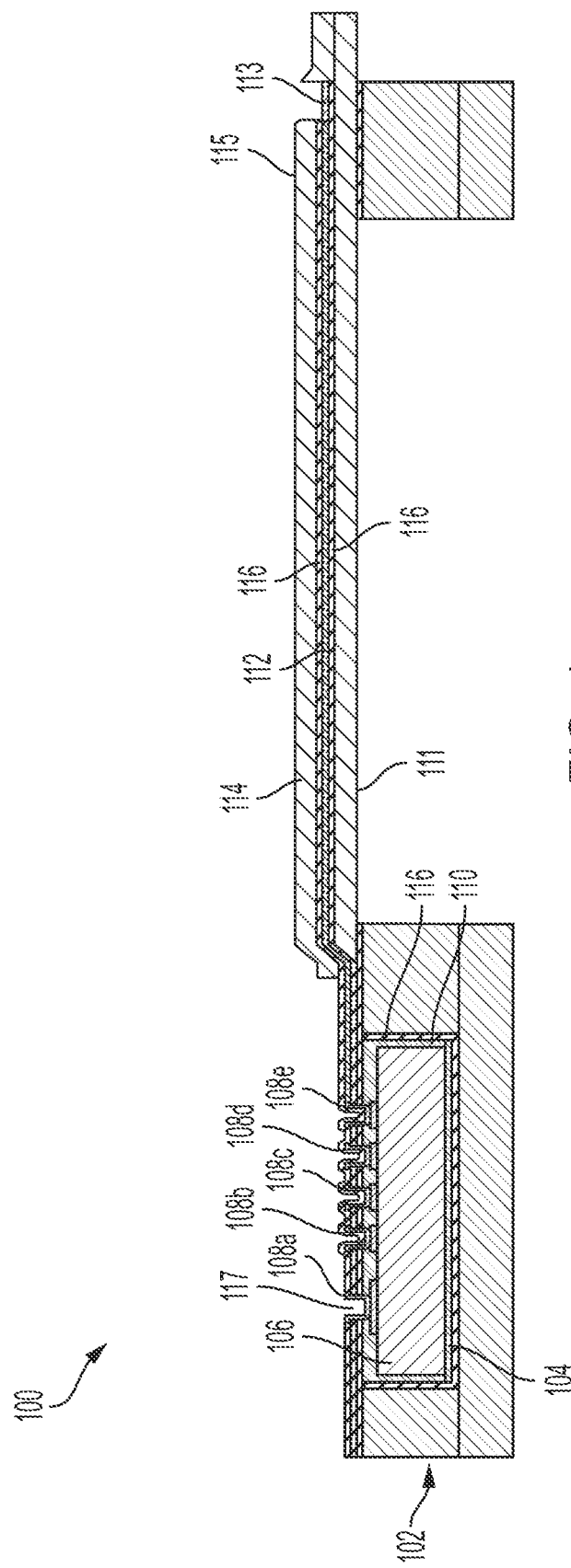
FIG. 1 illustrates a vertical cross-section of a sealed electrical device with an embedded integrated circuit (IC) chip, according to embodiments of the present disclosure.

FIG. 1 illustrates a vertical cross-section of a sealed electrical device 100 with an embedded integrated circuit (IC) chip 106, according to embodiments of the present disclosure.

The sealed electrical device 100 may be part of a brain implant. The sealed electrical device 100 can include a substrate 102 with material removed to form a pocket 104. As shown, the pocket 104 can be rectangular. The substrate 102 can be silicon, glass, alumina, aluminum nitride, titania, zirconia, cermet, polymer, ceramic (such as alumina or sapphire), or other materials as known in the art. In some embodiments, the substrate 102 can be a single crystal substrate of silicon or gallium nitride.

An IC chip 106 can be embedded into the pocket 104 of the substrate 102. In some examples, the IC chip 106 can be a bare die or another relatively small chip that has been milled or ground to reduce its size. The IC chip 106 can be arranged within the pocket 104 such that connection pads 108a, 108b, 108c, 108d, and 108e of the IC chip 106 are facing outward (e.g., away from the pocket 104). Gaps between the IC chip 106 and the pocket 104 can be filled with a filler 110. In some examples, the filler 110 may be a polymer that is also cured into a polymer sheet.

The connection pads 108a-e may be connected to electrodes 113 via conductive traces 112 supported by a casing 114. The conductive traces 112 can be patterned onto a polymer sheet 111 and to the connection pads 108a-e. The conductive traces 112 can be further coated in polymer on top to form a ribbon cable 115. The conductive traces may include materials including conductive polymers such as poly(3,4-ethylenedioxythiophene) (PEDOT), conductive ceramics such as doped-diamonds, conductive metals such as gold, platinum, and platinum-iridium, or conductive metal oxides such as iridium oxide.

Because bare die IC chips can be embedded within the substrate, greater numbers of IC chips and conductive traces can be incorporated into the brain implant system. For example, the sealed electrical device 100 may have a density that is thirty times greater than a typical IC chip 106 and interface.

The sealed electrical device 100 can be sealed via a hermetic coating 116. In some embodiments, the hermetic coating 116 can be applied to the substrate 102 before the IC chip 106 is placed into the pocket 104. After placement, the hermetic coating 116 can be deposited over the IC chip 106. In this way, the hermetic coating 116 can hermetically seal the IC chip 106. In some examples, the hermetic coating 116 can additionally be deposited over the conductive traces 112, and the hermetic coating 116 may only be exposed at the site of the implanted electrodes 113. Examples of hermetic coating 116 can include silicon carbide, silicon oxide, hafnium oxide, or diamond.

Vias 117 can be etched through the hermetic coating 116 and the filler 110 to allow pathways for electrical connection between the connection pads 108a-e, the conductive traces 112, and the electrodes 113. In some examples, further coatings or layers can be deposited onto the IC chip 106 and the conductive traces 112. For example, insulation layers or structural support layers such as polyimide or liquid crystal polymer can be deposited. Release layers or adhesive layers can also be deposited between the substrate 102 and the conductive traces 112.

In some embodiments, a housing may be mounted about a perimeter of the pocket 104.

Figure 2:
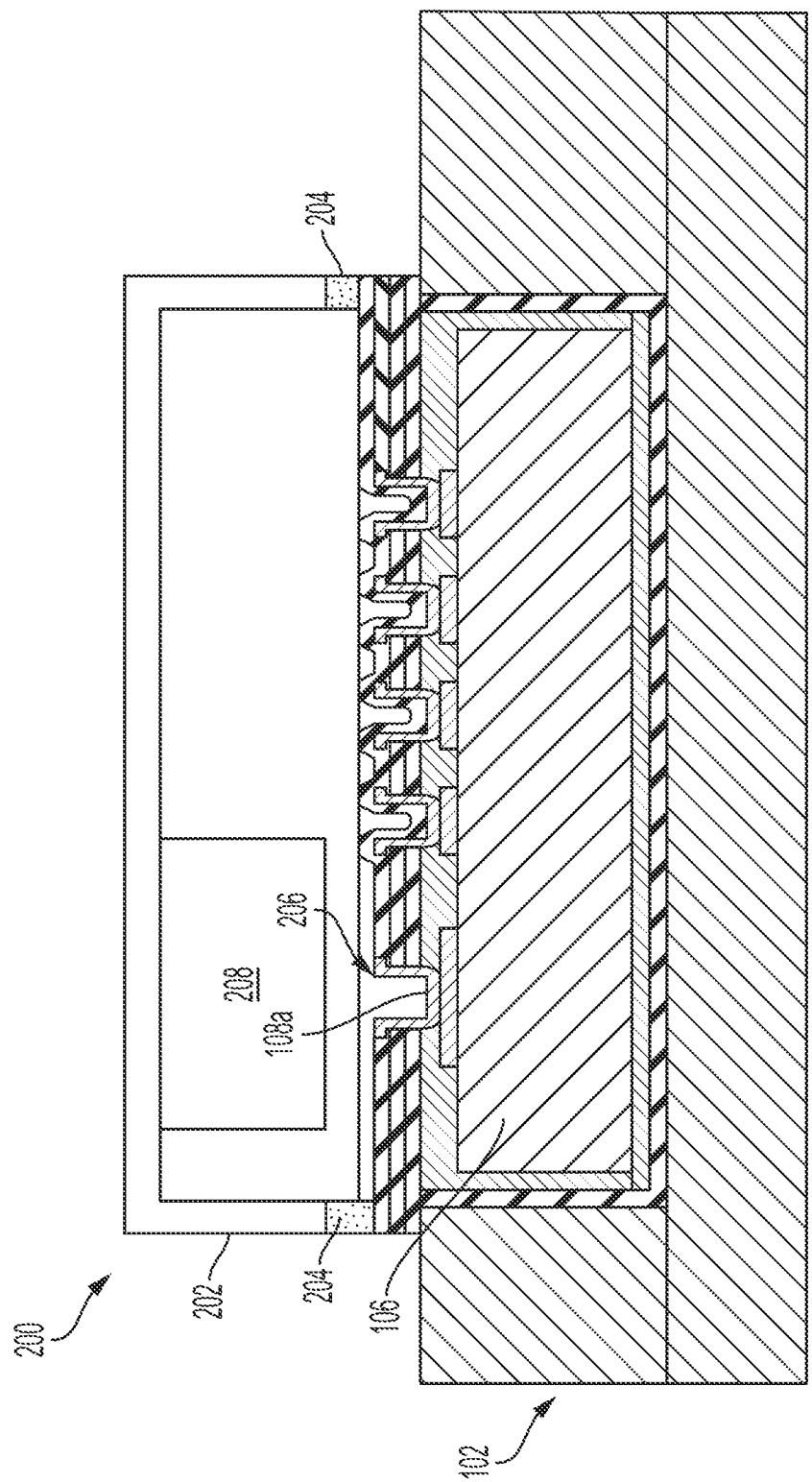
FIG. 2 illustrates a vertical cross-section of a sealed electrical device with an embedded IC chip and a housing, according to embodiments of the present disclosure.

FIG. 2 illustrates a vertical cross-section of a sealed electrical device 200 with an embedded IC chip 106 and a housing 202, according to embodiments of the present disclosure. The housing 202 and the substrate 102 left around the pocket 104 can enclose the IC chip 106. In some examples, a metal ring 204 may be affixed or formed around the perimeter of the pocket 104, and the housing 202 may be mounted onto the metal ring 204. The housing 202 and the hermetically sealed pocket 104 together may enclose and seal the IC chip 106. The housing 202 may be a cap or a lid or another configuration. The housing 202 may include a wire interface for the sealed electrical device 200.

The wire interface may include coils for power transmission and data transmission. For example, the unsealed connection pad 108a may be a power input pin 206 that can connect to components in the housing 202 for powering the sealed electrical device 100. For example, the power input pin 206 may connect to a circuit board 208 inside the housing 202. The power input pin 206 can include a voltage common collector (VCC) that is a higher voltage with respect to a ground. The power input pin 206 may be positive or negative with respect to the ground.

Figure 3:
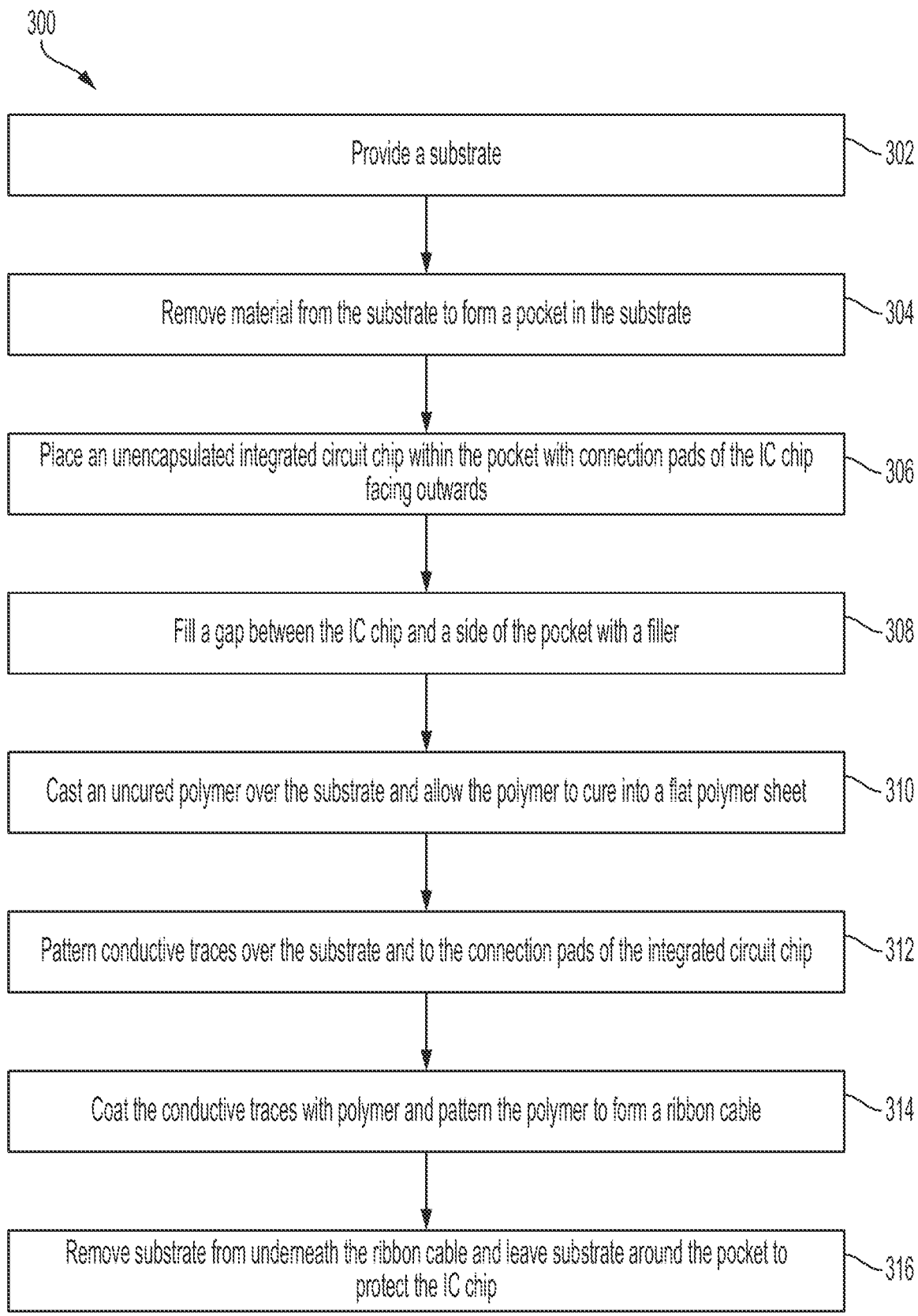
FIG. 3 is a flowchart illustrating a process for manufacturing a sealed electrical device, according to embodiments of the present disclosure.

FIG. 3 is a flowchart illustrating a process 300 for manufacturing a sealed electrical device 100, according to embodiments of the present disclosure. Aspects of FIG. 3 are described with respect to the components of FIGS. 1-2. At block 302, a substrate 102 is provided. The substrate 102 may be a silicon wafer, a glass wafer, a polymer panel, or a ceramic plate. At block 304, material is removed from the substrate 102 to form a pocket 104 in the substrate 102. The pocket 104 may be etched or milled into the substrate 102. The pocket 104 may be rectangular to accommodate a shape of an IC chip 106. In some examples, the pocket 104 may be formed into a substrate 102 that is a carrier that can facilitate electrical connections between an IC chip 106 and implanted electrodes 113 via conductive traces 112. In other examples, the pocket 104 may be formed into a substrate 102 that is itself embedded into a carrier. In some embodiments, a hermetic coating 116 can be deposited over the substrate 102 and the pocket 104. For example, the hermetic coating 116 can be deposited as an atomic layer deposition of hafnium oxide or a chemical vapor deposition of diamond. By depositing the hermetic coating 116 before an IC chip 106 is placed within the pocket 104, the IC chip 106 can be hermetically protected via a hermetic coating 116 that can fully encapsulate the entire IC chip 106.

At block 306, an unencapsulated IC chip 106 is placed within the pocket 104 with connection pads 108 of the IC chip 106 facing outwards. The IC chip 106 may be attached to the pocket 104 with polymer adhesives or via metal thermocompression. If the hermetic coating 116 was deposited into the pocket 104 prior to placement of the IC chip 106, the IC chip 106 may be attached to the hermetic coating 116 within the pocket 104. As a size of the IC chip 106 may be smaller than a size of the pocket 104, a gap may be formed between the IC chip 106 and the pocket 104.

At block 308, the gap between the IC chip 106 and a side of the pocket 104 is filled with a filler 110. The filler 110 may secure the IC chip 106 within the pocket 104. In some embodiments, the filler 110 may be a polymer. In such embodiments, the process can involve planarizing the substrate 102 with the IC chip 106 and the polymer. For example, at block 310, an uncured polymer is cast over the substrate and allowed to cure into a flat polymer sheet. The flat polymer sheet may be planarized and polished to flatten and smooth excess polymer off of the substrate 102. In some examples, the hermetic coating 116 can then be deposited over the IC chip 106. Vias can be etched or cut through the hermetic coating 116 and the filler 110 to provide access to connection pads 108 of the IC chip 106.

At block 312, conductive traces 112 are patterned over the substrate 102 and the connection pads 108 of the IC chip 106. For example, the conductive traces 112 may be patterned into the vias that were cut through the hermetic coating 116 and the filler 110. In alternative examples where the hermetic coating 116 was not applied prior to patterning conductive traces 112, the filler 110 may instead be etched or cut into vias for providing access to the connection pads 108. After patterning the conductive traces 112 to the connection pads 108 through the vias, the hermetic coating 116 can be deposited over the IC chip 106 and the conductive traces 112. Vias can then be etched into the hermetic coating 116 for digital and power connections to the IC chip 106. For example, vias can be etched through the hermetic coating 116 to power input pins 206 of the IC chip 106 (such as connection pad 108a). A circuit board 208 can be connected through the vias to the power input pins 206. Additionally, under-bump metallization or bumps can be added to the vias for connection with other components, such as other circuit boards or other IC chips. The under-bump metallization and bumps can be designed to overlap opening edges to further seal the openings. Vias may be formed using etching, laser cutting, or milling. By hermetically sealing the IC chip 106 and the conductive traces 112 (except for at openings of the electrodes 113), analog channels for the IC chip 105 can be hermetically sealed.

At block 314, the conductive traces 112 are coated with polymer, and the polymer is patterned, to form a ribbon cable. For example, the ribbon cable may be lithographically formed on the substrate 102 to connect the conductive traces 112 to connection pads 108 of the IC chip 106. In some examples, additional conductive layers and insulation layers can be deposited and patterned on the IC chip 106 and the conductive traces 112. The conductive layers and insulation layers may shield the pocket 104 and may electrically connect the conductive traces 112 and the electrodes 113 to the IC chip 106.

At block 316, substrate 102 is removed from underneath the ribbon cable, with some substrate 102 left around the pocket 104 to protect the IC chip 106. The substrate 102 left around the pocket 104 may include hermetic coating 116.

A housing 202 can be mounted around a perimeter of the pocket 104. As the perimeter of the pocket 104 can include the hermetic coating 116, the housing 202 together with the substrate 102 can enclose and hermetically seal the IC chip 106 and the conductive traces 112. To mount the housing 202 to the substrate 102, a metal ring 204 can be formed on the perimeter of the pocket 104 and onto the hermetic coating 116 for bonding and sealing to the housing 202. Surfaces of the substrate 102 can be made planar prior to adding the metal ring 204 by incorporating and then planarizing excess insulation material from insulation layers using lapping, grinding, polishing, or fly cutting. Alternatively, grooves can be etched inside the insulation layer prior to deposition or growth of a conductive layer. The conductive layer and the insulation layer can then be planarized by lapping, grinding, polishing, fly cutting, or selective etching. Instead of planarizing the surface under the metal ring 204, the metal ring 204 can be made compressible. For example, the metal ring 204 may have a compressible geometry, such as having a triangular cross-section. In another example, the metal ring 204 may have compressible material properties (such as porosity or ductility) to account for topography.

After the metal ring 204 is formed on the perimeter of the pocket 104, a laser weld can be used for bonding and sealing the metal ring 204 to the housing 202. Materials such as amorphous silicon or silicon oxide can be deposited over a seal region of the metal ring 204, planarized, polished, put into contact with the housing 202 (which can be a glass material), and then laser welded. Alternatively, rather than using a metal ring 204 to attach the housing 202 to the substrate 102, a seal region of the substrate 102 can be planarized and polished prior to depositing amorphous silicon or silicon oxide. The housing 202 may be contacted to the seal region and laser welded onto the substrate 102.

In some examples, such as the process described below with respect to FIG. 4, the IC chip 106 may be embedded into the substrate 102 before an interface (e.g., the conductive traces 112 and the electrodes 113) is formed above the substrate 102, in a "chip-first" process. In other examples, desired processes or materials for fabricating the interface (e.g., the conductive traces 112 and the electrodes 113) may require relatively high temperatures that may damage the IC chip 106. Example materials and processes include conductive diamond, insulating diamond, chemical vapor deposition, polymer curing annealing, and sintering. To incorporate these processes and materials, such as in the process described below with respect to FIG. 5, the interface may be fabricated before the IC chip 106 is embedded into the substrate 102, in a "chip-last" process. For example, after the interface is fabricated onto the substrate 102, the IC chip 106 may then be embedded and insulation layers, and conductive layers can be added to electrically connect the interface with the IC chip 106.

Figure 4:
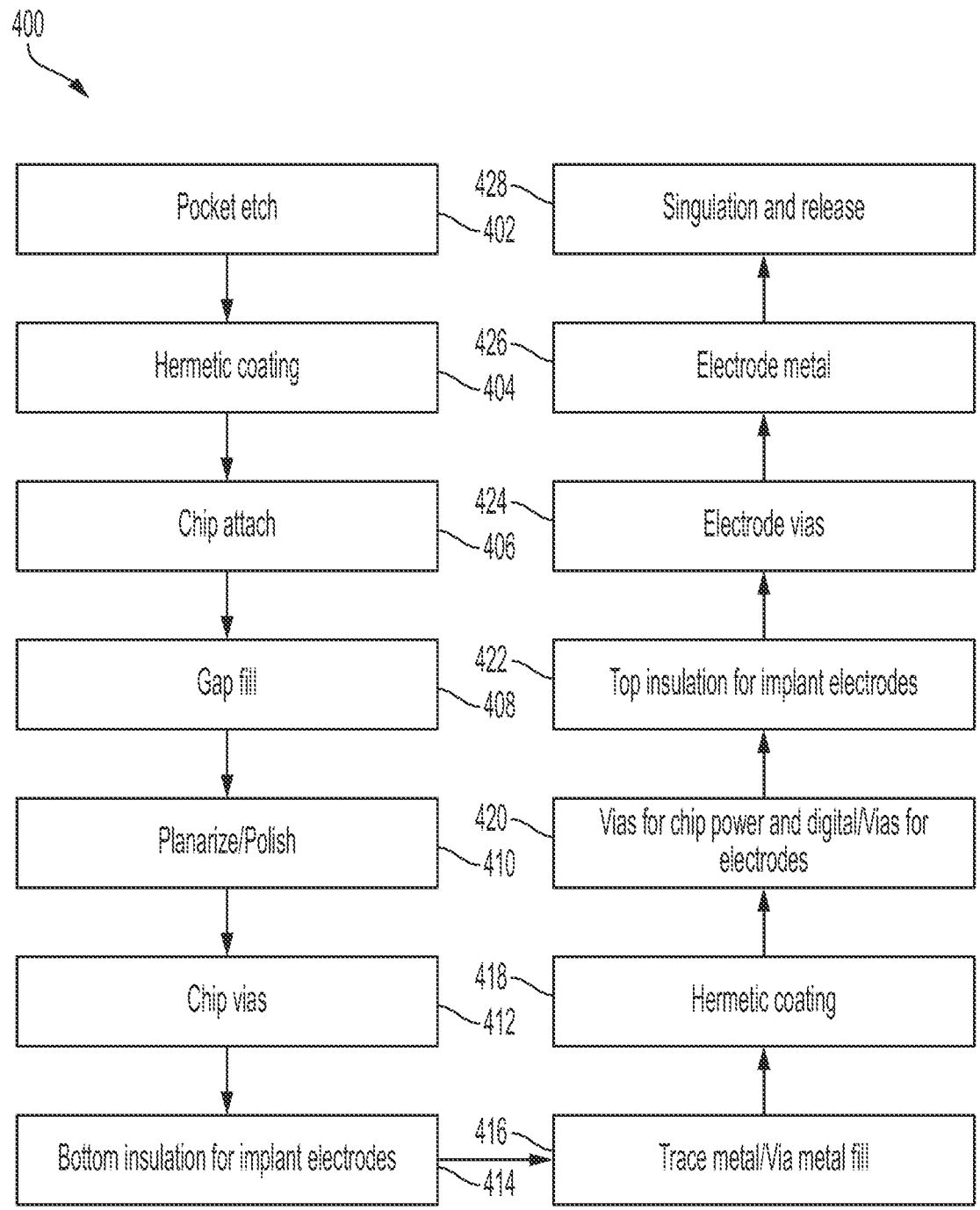
FIG. 4 is a flowchart illustrating a chip-first process for manufacturing a sealed electrical device, according to embodiments of the present disclosure.

FIG. 4 is a flowchart illustrating a chip-first process 400 for manufacturing a sealed electrical device 100, according to embodiments of the present disclosure. Aspects of FIG. 4 are described with respect to the components of FIGS. 1-2. At block 402, a pocket 104 is etched or milled into a substrate 102. The pocket 104 may be rectangular and may be shaped and sized to accommodate an IC chip 106 within the pocket 104. At block 404, a hermetic coating 116 is deposited onto the substrate 102 and the pocket 104. By depositing the hermetic coating 116 onto the pocket 104 before placing an IC chip 106, further deposits of hermetic coating 116 onto such an IC chip 106 can encapsulate and hermetically seal the IC chip 106. In some examples, the pocket 104 can additionally be lined with a conductive material for shielding the IC chip 106.

At block 406, an IC chip 106 is attached to the pocket 104. For example, the IC chip 106 can be attached to the hermetic coating 116 within the pocket 104. At block 408, a gap formed between the IC chip 106 and sides of the pocket 104 is filled with a filler 110, such as a polymer. At block 410, the filler 110 is planarized and polished in preparation for fabrication of an interface. The interface can include electrical components that connect to the IC chip 106, such as circuit boards 208, power sources for the IC chip 106, and conductive traces 112 for connecting the IC chip 106 to implanted electrodes 113.

At block 412, vias are etched into the filler 110 to provide access to the IC chip 106. For example, vias can be etched to access connection pads 108 of the IC chip 106. At block 414, a bottom insulation layer for implant electrodes 113 is deposited onto the substrate 102. The bottom insulation layer may insulate the electrodes 113. At block 416, trace metals or via metal fills are patterned onto the bottom insulation layer. At block 418, a hermetic coating 116 is deposited over the substrate 102. For example, the hermetic coating 116 may be deposited over the IC chip 106 and the bottom insulation layer. At block 420, vias are etched into the hermetic coating 116. For example, vias can be etched into the hermetic coating 116 to provide power and digital communication to the connection pads 108 of the IC chip 106. Additionally, vias can be etched into the hermetic coating 116 to provide access between the connection pads 108 of the IC chip 106 and the electrodes 113. Conductive traces 112 can be patterned into the vias.

At block 422, a top insulation layer for implant electrodes 113 is deposited onto the substrate 102. The top insulation layer in conjunction with the bottom insulation layer may insulate the implant electrodes 113. At block 424, vias are etched into the insulation layer to provide access to the electrodes 113. At block 426, the electrodes 113 are connected to the conductive traces 112 to form the interface. At block 428, the IC chip 106 is singulated and released to be used in a brain implant system.

Figure 5:
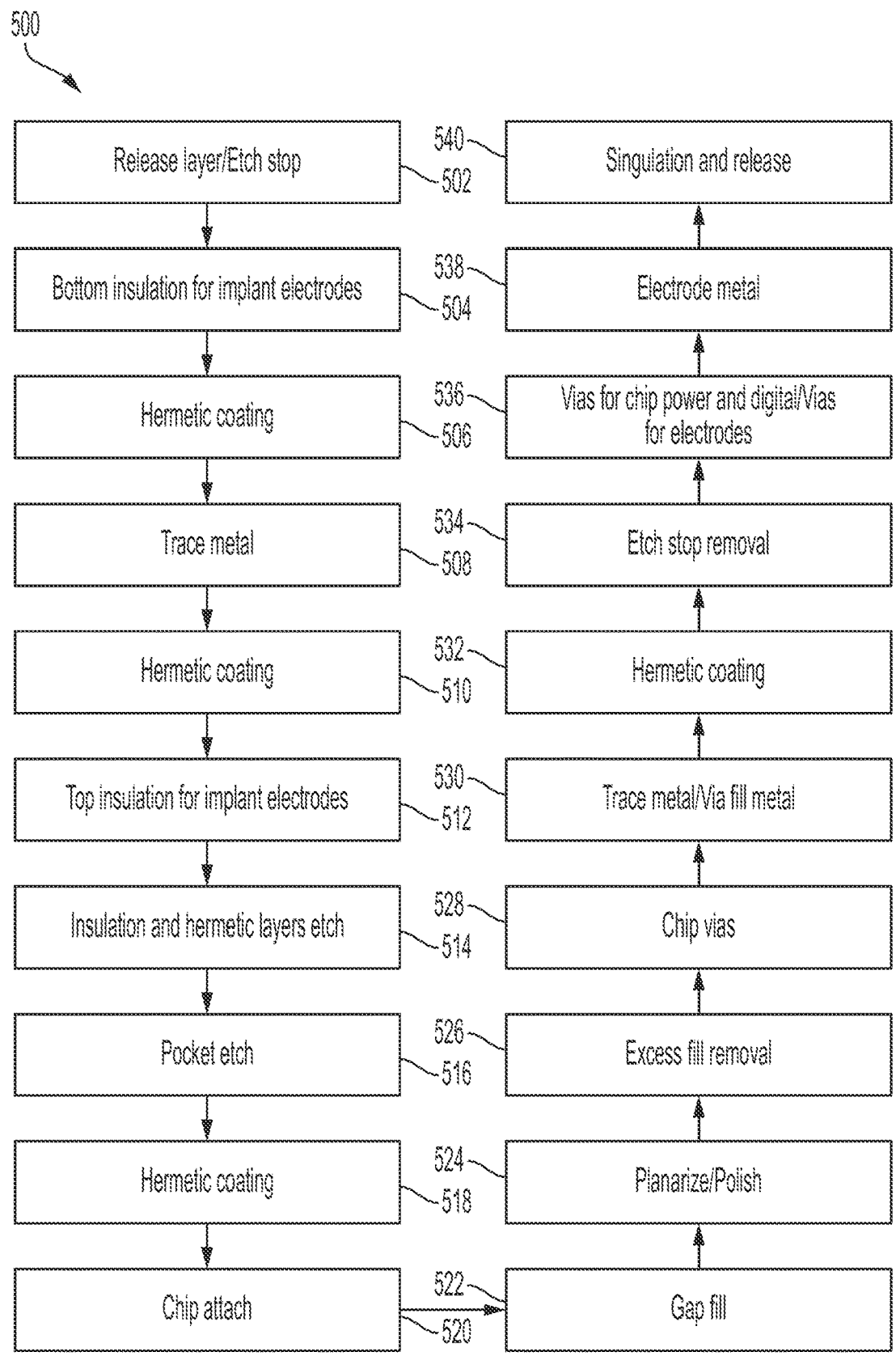
FIG. 5 is a flowchart illustrating a chip-last process for manufacturing a sealed electrical device, according to embodiments of the present disclosure.

FIG. 5 is a flowchart illustrating a chip-last process 500 for manufacturing a sealed electrical device 100, according to embodiments of the present disclosure. Aspects of FIG. 5 are described with respect to the components of FIGS. 1-2. At block 502, an etch stop is added to protect the substrate from later etches. It can also be used as a sacrificial layer for releasing the ribbon cable. At block 504, a bottom insulation layer for implant electrodes 113 is deposited onto the substrate 102. The bottom insulation layer may provide insulation for the electrodes 113. At block 506, a hermetic coating 116 is deposited onto the bottom insulation layer. The hermetic coating 116 may be deposited prior to fabrication of an implant interface. At block 508, trace metals, such as conductive traces 112, are patterned onto the hermetic coating. In some examples, the trace metals can be patterned into vias etched into the hermetic coating 116.

At block 510, another hermetic coating 116 is deposited onto the trace metals. The trace metals can therefore be hermetically sealed. At block 512, a top insulation layer for the implant electrodes 113 is deposited onto the substrate 102. Together with the bottom insulation layer, the top insulation layer can insulate the electrodes 113 and other components in the interface, such as the trace metals. At block 514, the insulation layers and hermetic layers are etched. For example, at block 516, a pocket 104 is etched into the substrate 102. The pocket 104 may be shaped and sized via the etch stop to accommodate an IC chip 106 within the pocket 104. At block 518, a hermetic coating 116 is deposited into the substrate 102 and the pocket 104 prior to insertion of an IC chip 106.

At block 520, an IC chip 106 is attached to the pocket 104. For example, the IC chip 106 can be attached to the hermetic coating 116 within the pocket 104. There may be a gap between the IC chip 106 and sides of the pocket 104 that are coated by the hermetic coating 116. At block 522, the gap is filled with a filler 110, such as a polymer. In some examples, the substrate 102 may additionally be coated by the filler 110. At block 524, the surface of the substrate 102 is planarized and polished. For example, excess polymer material of the filler 110 may be removed and smoothed to create a planar surface between the substrate 102 and the IC chip 106. At block 528, vias can be etched into the filler 110 to allow access to the IC chip 106. For example, vias can be etched to expose connection pads 108 of the IC chip 106 that are facing outwards from the pocket 104.

At block 530, the trace metals are connected with the exposed connection pads 108 of the IC chip 106 through the vias. At block 532, a hermetic coating 116 is deposited onto the trace metals and the connection pads 108. The coated trace metals can thus be formed into ribbon cables, and the IC chip 106 and metal traces can be hermetically sealed. At block 534, etch stop is used to remove substrate 102 from underneath the ribbon cables, while leaving substrate 102 around the pocket 104 to protect the IC chip 106. At block 536, vias are etched into the hermetic coating 116 to provide power and digital communication access to power input pins 206 of the IC chip 106. Additionally, vias are etched into the hermetic coating 116 to expose ends of the electrodes 113. At block 538, metals can be patterned in the electrode vias. At block 540, the IC chip 106 is singulated and released to be used in a brain implant system.

It should be appreciated that a brain implant or other system and a respective control system for the brain implant can have one or more microprocessors/processing devices that can further be a component of the overall apparatuses. The control systems are generally proximate to their respective devices, in electronic communication (wired or wireless) and can also include a display interface and/or operational controls configured to be handled by a user to monitor the respective systems, to change configurations of the respective systems, and to operate, directly guide, or set programmed instructions for the respective systems, and sub-portions thereof. Such processing devices can be communicatively coupled to a non-volatile memory device via a bus. The non-volatile memory device may include any type of memory device that retains stored information when powered off. Non-limiting examples of the memory device include electrically erasable programmable read-only memory ("ROM"), flash memory, or any other type of non-volatile memory. In some aspects, at least some of the memory device can include a non-transitory medium or memory device from which the processing device can read instructions. A non-transitory computer-readable medium can include electronic, optical, magnetic, or other storage devices capable of providing the processing device with computer-readable instructions or other program code. Non-limiting examples of a non-transitory computer-readable medium include (but are not limited to) magnetic disk(s), memory chip(s), ROM, random-access memory ("RAM"), an ASIC, a configured processor, optical storage, and/or any other medium from which a computer processor can read instructions. The instructions may include processor-specific instructions generated by a compiler and/or an interpreter from code written in any suitable computer-programming language, including, for example, C, C++, C#, Java, Python, Perl, JavaScript, etc.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

In some embodiments, the systems and methods of the present disclosure can be used in connection with neurosurgical techniques. However, one skilled in the art would recognize that neurosurgical techniques are a non-limiting application, and the systems and methods of the present disclosure can be used in connection with any biological tissue. Biological tissue can include, but is not limited to, the brain, muscle, liver, pancreas, spleen, kidney, bladder, intestine, heart, stomach, skin, colon, and the like.

The systems and methods of the present disclosure can be used on any suitable multicellular organism including, but not limited to, invertebrates, vertebrates, fish, bird, mammals, rodents (e.g., mice, rats), ungulates, cows, sheep, pigs, horses, non-human primates, and humans. Moreover, biological tissue can be ex vivo (e.g., tissue explant), or in vivo (e.g., the method is a surgical procedure performed on a patient).

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment. Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

What is claimed is:

1. A method of manufacturing a sealed electrical device, the method comprising:
   providing a substrate;
   removing material from the substrate to form a pocket in the substrate;
   placing an unencapsulated integrated circuit (IC) chip within the pocket with connection pads of the IC chip facing outward;
   filling a gap between the IC chip and a side of the pocket with a filler;
   casting an uncured polymer over the substrate and allowing the polymer to cure into a flat polymer sheet;
   patterning conductive traces on the polymer sheet and to the connection pads of the IC chip;
   coating the conductive traces with polymer to form a ribbon cable; and
   removing a portion of the substrate from underneath the ribbon cable, and leaving a portion of the substrate around the pocket to protect the IC chip.

2. The method of claim 1 further comprising:
   mounting a housing to a perimeter of the pocket,
   wherein the housing and the substrate left around the pocket enclose the IC chip.

3. The method of claim 2 further comprising:
   forming a metal ring on the perimeter of the pocket,
   wherein the housing is mounted onto the metal ring.

4. The method of claim 1 further comprising:
   depositing a hermetic coating over the IC chip within the pocket and before patterning the conductive traces; and
   etching vias through the hermetic coating to the pads of the IC chip.

5. The method of claim 1 further comprising:
   depositing a hermetic coating over the IC chip and the conductive traces;
   etching vias through the hermetic coating to power input pins of the IC chip; and
   connecting a circuit board through the vias to the power input pins.

6. The method of claim 1 further comprising:
   depositing a hermetic coating over the substrate and into the pocket before placing the IC chip within the pocket, thereby adding hermetic protection to the IC chip within the pocket.

7. The method of claim 6 wherein the hermetic coating is selected from the group consisting of silicon carbide, hafnium oxide, and diamond.

8. The method of claim 1 wherein the filling of the gap includes filling the gap with a polymer, the method further comprising:
   planarizing the substrate with the chip and the polymer.

9. The method of claim 1 wherein the substrate is ceramic, glass, or polymer.

10. The method of claim 1 wherein the substrate is a single crystal substrate of silicon or gallium nitride.

11. The method of claim 1 wherein the pocket is rectangular.

* * * * *